United States Patent [19]
Mita et al.

[11] Patent Number: 5,252,851
[45] Date of Patent: Oct. 12, 1993

[54] SEMICONDUCTOR INTEGRATED CIRCUIT WITH PHOTO DIODE

[75] Inventors: Keizi Mita; Tsuyoshi Takahashi; Toshiyuki Ohkoda, all of Oizumimachi; Tadayoshi Takada, Fukayashi, all of Japan

[73] Assignee: Sanyo Electric Co., Ltd., Moriguchi, Japan

[21] Appl. No.: 827,254

[22] Filed: Jan. 28, 1992

[51] Int. Cl.⁵ .................... H01L 27/14; H01L 31/00
[52] U.S. Cl. .................... 257/446; 257/461
[58] Field of Search ............. 257/446, 461, 463, 443, 257/462

[56] References Cited

U.S. PATENT DOCUMENTS

| 4,831,430 | 5/1989 | Umeji | 357/30 P |
| 5,101,253 | 3/1992 | Mizutani et al. | 357/30 P |

FOREIGN PATENT DOCUMENTS

| 59-96781 | 6/1984 | Japan | 357/30 P |
| 61-47664 | 3/1986 | Japan | 257/446 |
| 61-216464 | 9/1986 | Japan | 357/30 P |
| 62-39080 | 2/1987 | Japan | 357/30 P |
| 1205564 | 8/1989 | Japan | 257/446 |

*Primary Examiner*—Rolf Hille
*Assistant Examiner*—Minhloan Tran
*Attorney, Agent, or Firm*—Thomas R. Morrison

[57] ABSTRACT

An optical semiconductor is integrated with a transistor by epitaxially growing a lightly doped epitaxial layer on a substrate. One isolated island area of the epitaxial layer contains a diffusion area on its surface to form the optical semiconductor. A second isolated island area has its conductivity type inverted by a buried layer that is diffused upward into contact with a surface layer that is diffused downward. The upward-diffused and downward-diffused layers unite to form a collector of the transistor. A base area in the surface of the collector contains an emitter in its surface. The emitter and the diffusion area are formed of the same material, and in the same process steps.

9 Claims, 7 Drawing Sheets

SEMICONDUCTOR INTEGRATED CIRCUIT WITH PHOTO DIODE

BACKGROUND OF THE INVENTION

This invention relates to integrated circuits and, more particularly, to integrated circuits which include an optical semiconductor device integrally formed with a photo diode and a bipolar IC.

A monolithic optical semiconductor device is formed integrally with a light receiving element and a peripheral circuit with a hybrid IC combined with a separately produced light receiving element and other circuit elements. It has been found that such a monolithic optical semiconductor device is produced at a lower cost than similar elements built up from discrete components, and is relatively free from noise caused by external electromagnetic fields.

Referring to FIG. 9, a light receiving element of a conventional optical semiconductor device is disclosed in, for example, Japanese Laid-open Patent Publication 61-47664. The conventional optical semiconductor device includes an N-type epitaxial layer 2 formed on a P-type substrate 1. A plurality of N-type island areas 4 are isolated from each other by P+-type isolating areas 3 therebetween. A photo diode 7 is formed in an upper surface of one of the illustrated N-type island areas by a PN junction between a P−-type diffusion area 5 and an N+-type diffusion area 6. An N+-type buried layer 8 spans the interface between N-type area 4 and P-type substrate 1.

A companion NPN transistor 9, in its own N-type island area 4, includes an N+-type buried layer 8 spanning the interface between N-type area 4 and P-type substrate 1. An n-type well area 10 is formed in N-type island area 4. A P-type base area 40 is formed in the upper surface of N-type well area 10. An N+-type emitter area 41 is disposed in the upper surface of P-type base area 40. An N+-type collector contact area 41 is disposed in the upper surface of N-type well area 10.

To obtain improved performance from photo diode 7, the resistivity of its island area 4, which will be a cathode, is preferably made as large as possible, in order to reduce the capacitance of the device. However, when N-type epitaxial layer 2 is grown on P-type substrate 1, impurities tend to migrate from P-type substrate 1, or from external sources, into N-type epitaxial layer 2. The impurities are mainly P-type impurities derived from boron auto doping. Therefore, when doping for high resistivity in N-type epitaxial layer 2, the migration of P-type impurities into N-type epitaxial layer 2 makes it difficult to ensure that N-type epitaxial layer 2 actually remains N-type, instead of being converted to P-type by the impurities. The incorporation of N-type well area 10 in the N-type island area 4 of NPN transistor 9 tends to compensate for the concentration of P-type impurites in this area. As a result, lower resistivity is attainable for improved performance of photo diode 7.

Nevertheless, the problem of excessive P-type impurities still limits the amount by which resistance value and conductivity can be controlled.

Because high resistivity is not available, it is impossible to increase the width of the depletion layer forming the PN junction of photo diode 7. Therefore it is impossible to reduce the junction capacitance, which determines the properties of photo diode 7, as much as would otherwise be possible.

A further disadvantage of this prior-art device is that the response speed of photo diode 7 is degraded by the relatively long transit time of carriers originating outside the depletion layer in the depth of P-type diffusion area 5 or epitaxial layer 2.

OBJECTS AND SUMMARY OF THE INVENTION

It is therefore a general object of this invention to provide an integrated circuit (IC), that includes a high performance photo diode.

It is a further object of the invention to provide an integrated circuit having a transistor formed in a collector of inverted conductivity type in a first island area in an epitaxial layer, and a photo diode in a surface of a second island area in the epitaxial layer.

It is a still further object of the invention to provide an integrated circuit having a transistor and a photo diode, wherein the diffusion area of the photo diode and the emitter of the transistor are formed of the same material during the same process steps.

Briefly stated, the present invention provides an optical semiconductor that is integrated with a transistor by epitaxially growing a lightly doped epitaxial layer on a substrate. One isolated island area of the epitaxial layer contains a diffusion area on its surface to form the optical semiconductor. A second isolated island area has its conductivity type inverted by a buried layer that is diffused upward into contact with a surface layer that is diffused downward. The upward-diffused and downward-diffused layers unite to form a collector of the transistor. A base area in the surface of the collector contains an emitter in its surface. The emitter and the diffusion area are formed of the same material, and in the same process steps.

According to an embodiment of the invention, there is provided an optical semiconductor device comprising: a substrate of a first conductivity type, an epitaxial layer of the first conductivity type epitaxially grown on a surface of the substrate, the epitaxial layer having a resistivity which is substantially higher than a resistivity of the substrate, a separating area of the first conductivity type extending from a surface of the epitaxial layer to the substrate, the separating area defining a first island area for forming a photo diode and a second island area for forming a transistor, the separating area isolating the first island area from the second island area, a diffusion area of a second conductivity type on a surface of the first island area, the diffusion area having a resistivity which is substantially lower than a resistivity of the epitaxial layer, an inverted region of the second conductivity type in the island area extending from an upper surface thereof to the substrate, the inverted region forming a collector of the transistor, a base area of the first conductivity type on a surface of the collector area, and an emitter area of the first reverse conductivity type on a surface of the base area.

According to a feature of the invention, there is provided an optical semiconductor device comprising: a substrate of a first conductivity type, an epitaxial layer of the first conductivity type epitaxially grown on a surface of the substrate, the epitaxial layer having a resistivity which is substantially higher than a resistivity of the substrate, a separating area of the first conductivity type extending from a surface of the epitaxial layer to the substrate, the separating area defining a first island area for forming a photo diode and a second island area for forming a transistor, the separating area isolating the first island area from the second island area, a diffusion area of a second conductivity type on a surface of the first island area, the diffusion area having a resistivity which is substantially lower than a resistivity of the epitaxial layer, a first buried layer of a first reverse conductivity type buried in a boundary between the second island area and the epitaxial layer, a second buried layer of a second reverse conductivity type buried above the first buried layer and extending upward from the first buried layer, and a collector area of the second reverse conductivity type extending from a surface of the second island area downward into connection with the second buried layer.

According to a still further feature of the invention, there is provided an optical semiconductor comprising: a substrate of a first conductivity type, an epitaxial layer on the substrate autodoped to the first conductivity type, a barrier from the substrate completely through the epitaxial layer to a surface thereof and forming a closed island in the epitaxial layer, a cathode layer in an upper surface of the island, a first contact contacting the cathode layer, a second contact contacting the barrier and, autodoping of the epitaxial layer being sufficiently light to permit formation of a depletion layer starting in the cathode layer and extending completely through the island to the substrate and to the barrier, whereby no part of the depletion layer terminates in the island.

According to a still further feature of the invention, there is provided a transistor comprising: a substrate of a first conductivity type, an epitaxial layer grown on the substrate, the epitaxial layer being doped to the first conductivity type more lightly than is the substrate to produce a substantially higher resistivity in the epitaxial layer than in the substrate, a first buried layer of the first conductivity type at an interface between the substrate and the epitaxial layer, a second layer of the first conductivity type at a surface of the epitaxial layer congruent with the first buried layer, the first buried layer and the second layer defining a perimeter of an island area, the first buried layer being diffused upward and the second layer being diffused downward until they join each other, thereby isolating a contained portion of the epitaxial layer as an island area, a second buried layer of a second conductivity type at the interface between the substrate and the epitaxial layer in the island area, a second layer of the second conductivity type at a surface of the epitaxial layer aligned with the second buried layer, the second buried layer being diffused upward and the second layer being diffused downward until they join each other, thereby forming an region of inverted conductivity type in the island area, a base area of the first conductivity type in the surface of the region of inverted conductivity type, an emitter area of the second conductivity type in a surface of the base area and, a collector contact of the second conductivity type in a surface of the region of inverted conductivity type outside the emitter area.

According to a still further feature of the invention, there in provided a photo diode integrated with a transistor comprising: a P-type substrate, an epitaxial region grown on the P-type substrate of intrinsic material, and autodoped to P-type conductivity, a separating area extending from a surface of the epitaxial region to the P-type substrate, the separating region defining first and second island regions isolated from each other, an N+-type diffusion area in a surface of the first island region, an N+-type buried layer at an interface between the second island region and the substrate, a second N-type buried layer extending upward from the N+-type buried layer toward a surface of the second island, an N-type collector area extending downward from the surface of the second island into contact with the second N-type buried layer, a P-type base area in a surface of the N-type collector area and, an N+-type emitter area in a surface of the base area.

According to another feature of the invention, there is provided a method for making an optical semiconductor comprising: forming a P-type substrate, epitaxially growing an epitaxial layer on the P-type substrate, controlling doping of the epitaxial layer to produce a resistivity therein which is substantially greater than a resistivity of the substrate, forming a P+type separating region in the epitaxial layer extending from a surface of the epitaxial layer to the substrate and enclosing an island area therein forming an N+-type diffusion area in a surface of the epitaxial layer, forming a contact with the diffusion area; and, forming a contact with the separating region.

According to a feature of the invention, there is provided a method for making a transistor comprising: forming a P+-type substrate, growing an epitaxial layer on the substrate, the step of growing including autodoping the epitaxial layer with P-type impurities, forming a separating area extending from a surface of the epitaxial area to the substrate, and defining an island area, forming an N+-type first buried layer at an interface between the epitaxial area and the island area, forming an N-type type second buried layer, atop the buried layer, forming an N-type layer on a surface of the island area, diffusing the second buried layer upward, and diffusing the N-type layer downward until they meet to become a collector area of the transistor, forming a P-type base area in a surface of the collector area, forming an N+-type emitter area in a surface of the base area; and, forming an N+-type collector contact in the surface of the collector area, whereby an NPN transistor is formed.

According to a further feature of the invention, there is provided a method for making a photo diode integrated with a transistor: forming a P-type substrate, epitaxially growing an epitaxial area on the P-type substrate, the step of epitaxially growing including lightly P doping the epitaxial area, isolating first and second island areas in the epitaxial area from each other, inverting a conductivity type of the second island to N-type from a surface of the second island to its interface with the substrate, thereby forming a collector area, forming a P-type base area in a surface of the collector area, forming an N+-type diffusion area in a surface of the first island area; and, forming an N+-type emitter in a surface of the base area.

According to an aspect of this invention, as shown in FIG. 1, P-type epitaxial area 14 is formed on P-type substrate 13. P-type impurities enter epitaxial area 14 from substrate 13 by auto-doping, but do not lower the resistivity of epitaxial area 14 excessively. Since both layers are doped with the same type of impurities, it is not necessary to offset autodoping of epitaxial layer 14, as would be necessary if the impurity types were different, as they are in prior-art devices. It is easy therefore to produce a substantially intrinsic and high resistivity epitaxial area 14.

Further, since it is possible to produce the substantially intrinsic and high resistivity epitaxial area 14, a depletion area can extend all the way to substrate 13, thereby reducing the capacitance of photo diode 11.

Still further, since the depletion layer can extend to substrate 13, the production of carriers outside the depletion layer at an anode side can be reduced. In N+-type diffusion layer 18 at a cathode side, a shallow area of a high concentration of impurities is formed by emitter diffusion, thereby it is possible to eliminate the production of carriers outside the depletion layer and to reduce the transit time of produced carriers.

BRIEF DESCRIPTION OF THE ACCOMPANYING DRAWINGS

FIG. 1 is a cross section of an integrated photo diode and transistor device according to an embodiment of the present invention.

FIGS. 2(A)–2(I), 3(A)–3(B), 4(A)–4(B), 5(A)–5(E) and 6 are cross sections to which reference will be made in describing the fabrication of the device of FIG. 1.

DETAILED DESCRIPTION OF THE PREFERRED EMBODIMENTS

Figure 1:
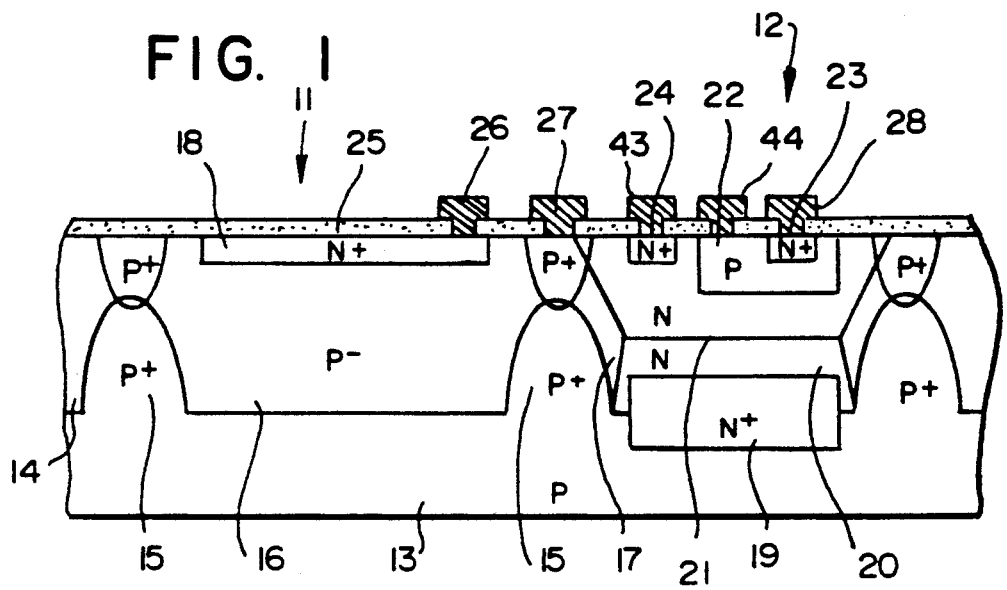

Referring to FIG. 1 a photo diode 11 and an NPN transistor 12 are formed on a common P-type single crystal silicon semiconductor substrate 13. Substrate 13 is doped to a resistivity of about 40 to 60 ohm-cm. A P−-type epitaxial area 14, having a thickness of 10 to 12 microns, is formed on substrate 13 by epitaxial vapor growth. Epitaxial area 14 is grown epitaxially intrinsic silicon, but is very lightly autodoped from by P-type impurities from substrate 13 to a P− condition. Because of the very light doping, a center region of epitaxial area 14 has a relatively high resistivity of about 200 to 1500 ohm-cm.

An upper surface of P−-type epitaxial area 14 contains a first island area 16 for forming photo diode 11 completely surrounded by a P+-type separating area 15 extending completely through epitaxial area 14 from its upper surface to substrate 13. A second island area 17 for forming NPN transistor 12 is similarly defined by P+-type separating area 15.

Photo diode 11, which receives optical input signals, is formed on first island area 16 by an N+-type diffusion area 18 which covers most of the top surface of first island area 16. Thus, N+-type diffusion area 18 forms a large-area PN junction with first island area 16. The diffusion depth of N+-type diffusion area 18 is from about 0.8 to 1.0 micron. An electrode 27, contacting P+-type separating area 15, serves as the second electrode for photo diode 11. Due to the high level of doping, N+-type diffusion area 18 has a low resistivity of about 10 to 20 ohms.

Figure 10:
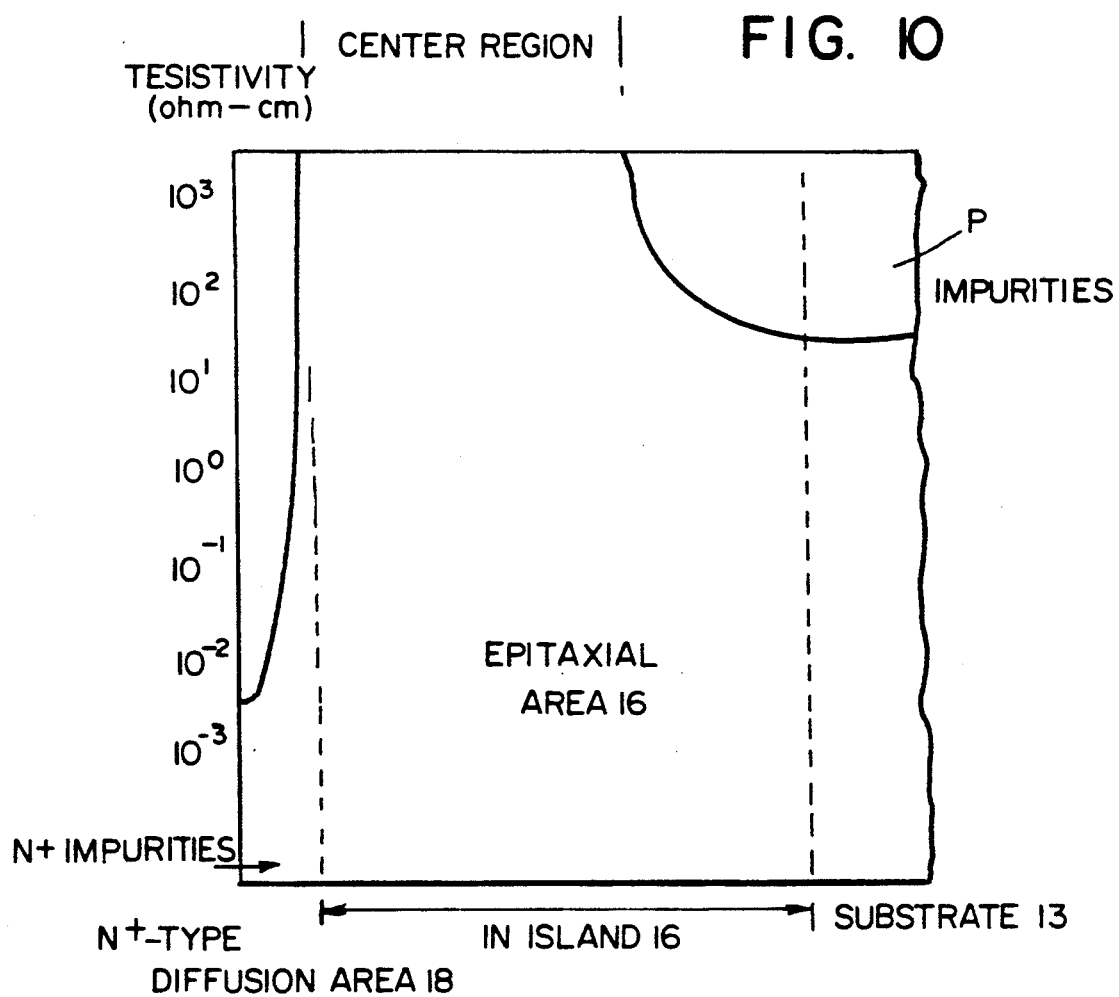
FIG. 10 is a curve illustrating the resistivity along a vertical cross section of the photo diode of FIG. 1.

Referring to FIG. 10, a plot of resistivity versus vertical position through island 16 is shown. Beginning at the left of the figure, the resistivity in N+-type diffusion area 18 is about 0.003 ohm-cm, increasing slightly as it approaches the interface with epitaxial area 16. The upper part of epitaxial area 16, near the left of the figure, exhibits a relatively low resistivity, due to diffusion of N-type impurities thereinto from diffusion area 18. The resistivity in epitaxial area 16 increases with increasing distance from diffusion area 18 until it reaches a maximum of between 200 and 1500 ohm-cm at a center region, where the resistivity stays relatively constant at increasing depths until the resistivity begins decreasing again due to the diffusion of P-type impurities thereinto from substrate 13. At the interface between diffusion area 18 and substrate 13, the resistivity is reduced to about 50 ohm-cm. At regions further from the interface, the resistivity in substrate 13 decreases slightly below about 50 ohm-cm.

The exact values of resistivity recited in the preceding, and shown in FIG. 10, are for purposes of illustration only. Different values may be attained without departing from the spirit and scope of the invention. The important element to notice is that, although the resistivity is relatively low at the upper and lower limits of island area 16, due to diffusion of impurities from across the interfaces, the resistivity increases in a center region to a value substantially greater than at the interfaces.

NPN transistor 12, which is a signal processing circuit, is formed in second island area 17. An N+-type buried layer 19 is formed on the bottom of second island area 17 crossing the boundary between substrate 13 and epitaxial area 14. A second buried layer 20 of low impurity concentration overlaps first buried layer 19. Second buried layer 20 is diffused upwardly from the boundary between substrate 13 and epitaxial area 14. An N-type collector area 21 is formed on a surface of second island area 17. N-type collector area 21 extends downward into contact with second buried layer 20, thereby increasing the depth of N-type collector area 21 to include second buried layer 20. As a result, the combined collector area 20, 21, constituting the active portion of second island area 17, is changed from P-type to N-type to serve as the collector of NPN transistor 12.

A P-type base area 22 of NPN transistor 12 is formed in the upper surface of collector area 21. An N+-type emitter area 23 is formed in the upper surface of base area 22. An N+-type collector contact area 24 is formed in the upper surface of collector area 21. Separating area 15, defining second island area 17, completely surrounds the perimeter of collector area 21.

An oxidized membrane 25 covers the surface of epitaxial area 14. Five electrodes 26, 27, 28, 43 and 44 pass through holes in membrane 25 to contact respective elements thereunder. Electrode 26 contacts N-type diffusion area 18 of photo diode 11 to provide a cathode electrode. Electrode 27 contacts separating area 15 to provide an anode electrode for photo diode 11. Collector electrode 43 contacts collector contact area 24 of NPN transistor 12. Base electrode 44 contacts P-type base area 22. Emitter electrode 28 contacts N+-type emitter area 23.

An IC having the structure shown in FIG. 1 is produced by the following process.

Figure 2A:
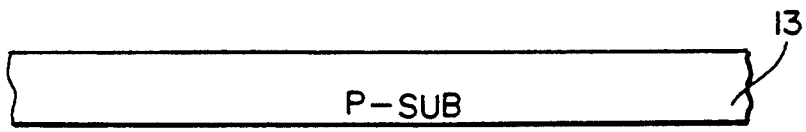

Referring to FIG. 2(A), P-type substrate 13 is doped to provide a resistivity of between about 40 and 60 ohm-cm.

Figure 2B:
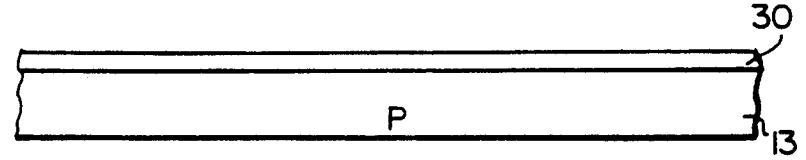

Referring to FIG. 2(B), the upper surface of P-type substrate 13 is heated in an oxygen atmosphere to produce a silicon dioxide insulating layer 30 having a thickness of from about 5,000 to about 7,000 Angstroms.

Figure 2C:
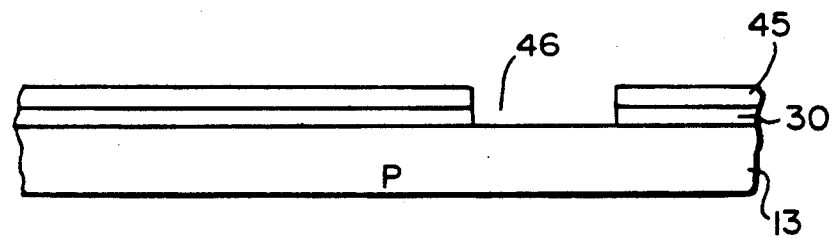

Referring now to FIG. 2(C), a conventional resist layer 45 is deposited on insulating layer 30 by any conventional means such as, for example, by spin coating. Resist layer 45 is baked, exposed, developed and etched by conventional means to produce an opening 46 through itself, and through insulating layer 30 to reveal the upper surface of p-type substrate 13.

Figure 2D:
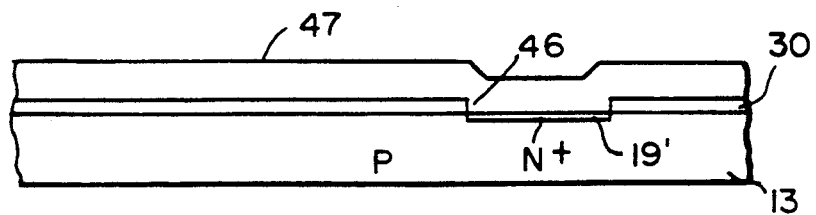

Referring now to FIG. 2(D), resist layer 45 is removed, and an antimony layer 47 is coated atop insulating layer 30, and particularly extending through opening 46 into contact with the upper surface of P-type substrate 13. The assembly is baked to diffuse a precursor layer of antimony to produce precursor N+-type area 19' in the pattern formed by opening 46.

Figure 2E:
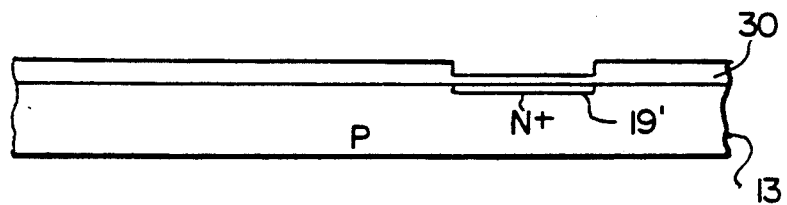

Referring now to FIG. 2(E), antimony layer 47 is removed and the assembly is baked further at about 1200° C. for about 30 minutes to diffuse the precursor N+-type area 19' and to develop an insulating layer about 400 to 500 Angstroms thick over substrate 13 in the area previously laid open by opening 46.

Figure 2F:
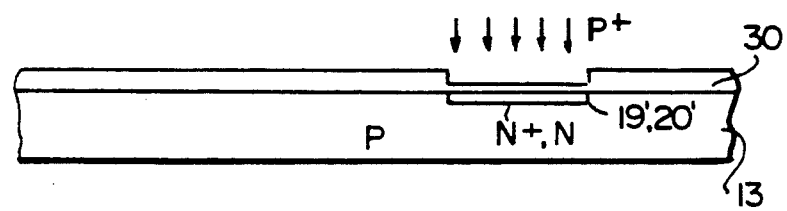

Referring now to FIG. 2(F), phosphorus is ion implanted in a concentration of about $10^{14}$ to $10^{15}$ per cm$^2$ at between 40 and 50 KeV to form a precursor layer 20' which will later be diffused to form second buried layer 20 above precursor N+-type area 19' (FIG. 1).

Figure 2G:
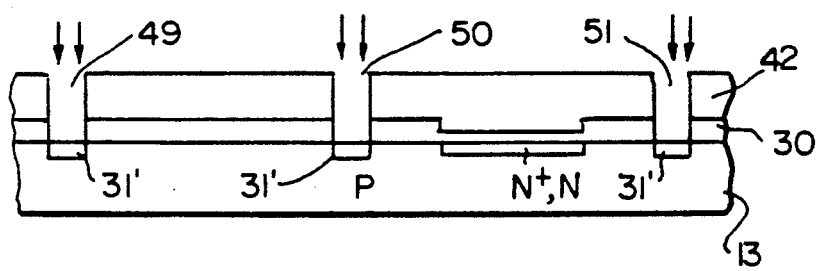

Referring now to FIG. 2(G), a conventional negative resist layer 48 is coated over the upper surface of oxidized layer 30, baked, exposed, developed and etched to produce openings 49, 50 and 51 through itself, and through oxidized layer 30. Boron is ion implanted in a concentration of about $10^{14}$ to $15^{15}$ per cm$^2$ at between 40 and 50 KeV through openings 49, 50 and 51 to produce corresponding precursor areas 31' for lower separating areas 31 (FIG. 1).

Figure 2H:
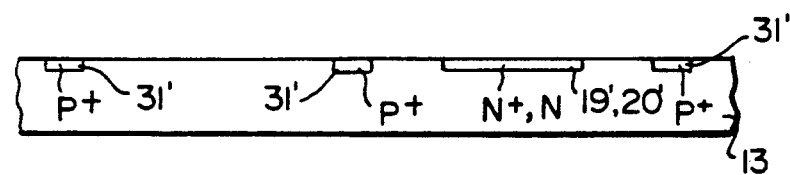

Referring now to FIG. 2(H), resist layer 48 and oxidized layer 30 are completely removed by conventional etching with hydrogen fluoride to produce a clean upper surface of P-type substrate 13, which now includes the deposits therein produced by the prior steps in the process.

Figure 2I:
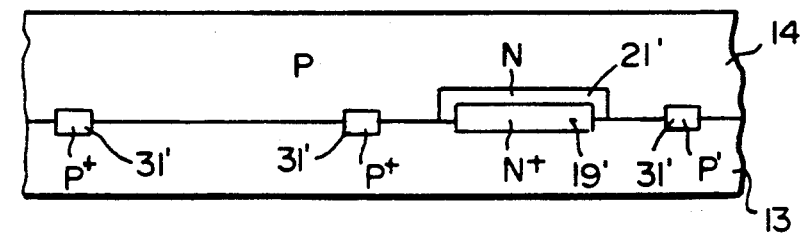

Referring now to FIG. 2(I), substrate 13 is mounted on a susceptor of a conventional epitaxial layer growing device (not shown). Substrate 13 is heated by a lamp to a temperature of about 1,140° C. Then, SiH$_2$Cl$_2$ gas and H$_2$ gas are introduced into a reaction tube, thereby growing an epitaxial area 14 from intrinsic (non-doped) material to a thickness of about 10 to 12 microns. The growth of epitaxial area 14 on substrate 13 buries precursor areas 13', 19' and 20' between them. When epitaxial area 14 is grown in this way, the whole of epitaxial area 14 becomes a very lightly doped P-type layer of a high resistivity of about 200 to 1500 ohm-cm due to automatic doping by diffusion of boron from the P-type material of substrate 13.

Figure 3A:
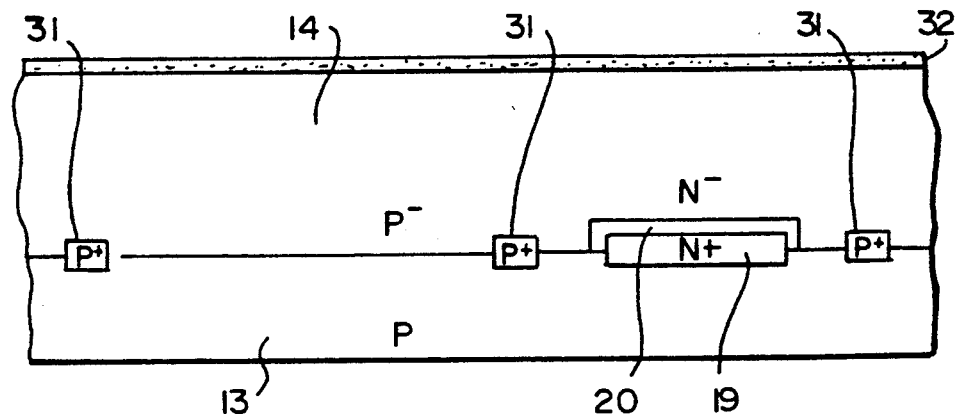

Referring now to FIG. 3(A), an oxidized membrane 32 is formed on the surface of epitaxial area 14.

Figure 3B:
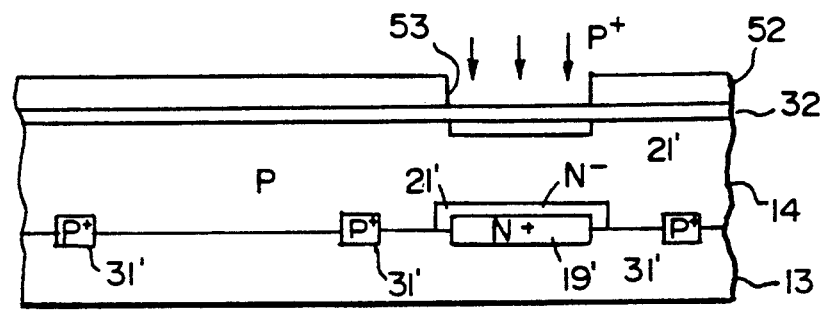

Referring now to FIG. 3(B), a resist layer 52 is applied over oxidized membrane 32, baked, exposed and etched to form an opening 53 therethrough. Phosphorus is implanted through opening 53 at a dose of $10^{12}$ to $10^{13}$ per cm$^2$ at 40 to 50 KeV to form a precursor 21' of N-type collector area 21 of NPN transistor 12.

Figure 4A:
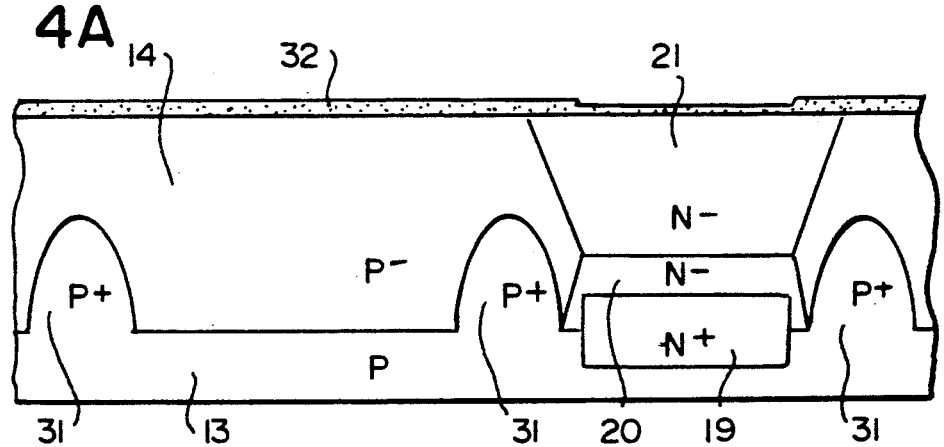

Referring now to FIG. 4(A), resist layer 52 is removed, and the assembly is baked at about 1180° C. for 10 hours to diffuse the buried precursor layer 31' upward about 10 microns to produce lower separating areas 31. In addition, the heating diffuses precursor layers 19' and 20' upward to produce N+-type buried layer 19 and second buried layer 20, and diffuses precursor layer 21' downward to form N-type collector area 21. Second buried layer 20 diffuses upward from 7 to 9 microns, while collector area 21 diffuses downward from 5 to 6 microns, whereby second buried layer 20 and collector area 21 unite with each other to form a single collector area.

During the foregoing diffusion step, the thickness of oxidized membrane 32 grows to between 5000 and 7000 Angstroms.

Figure 4B:
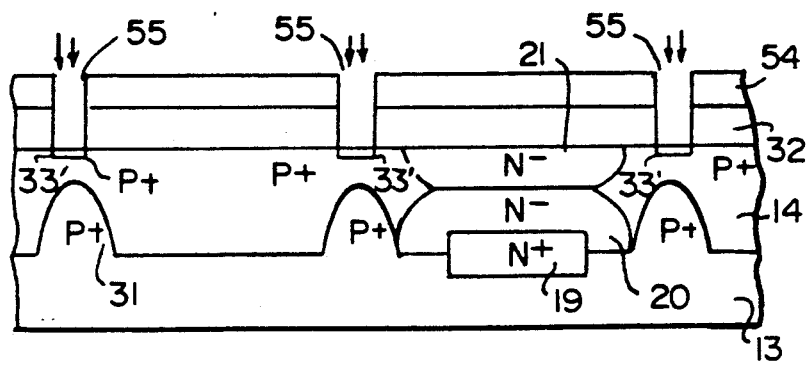

Referring now to FIG. 4(B), a further negative resist layer 54 is coated atop oxidized membrane 32, baked, and exposed to produce openings 55 through itself and through oxidized membrane 32 below it. Boron precursor layers 33' are deposited on the upper surface of epitaxial area 14.

Figure 5A:
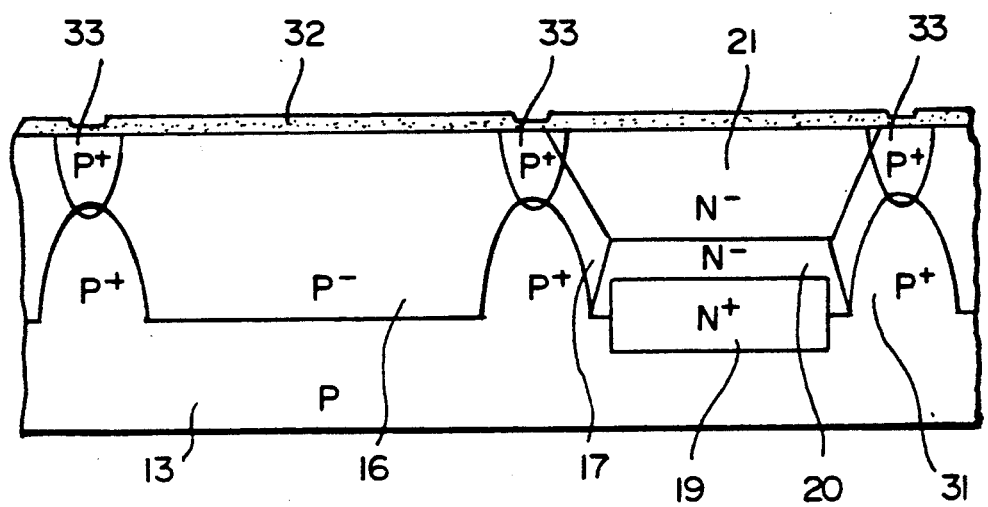

Referring to FIG. 5(A), resist layer 54 is removed, and the assembly is heated at about 1000° C. for about 1 to 2 hours to diffuse the boron in precursor layers 33' downward until they form upper separating areas 33, in contact with lower separating areas 31. In combination, lower separating areas 31 and upper separating areas 33 form complete barriers to divide epitaxial area 14 into first and second islands 16 and 17 that will form photo diode 11 and NPN transistor 12.

Figure 5B:
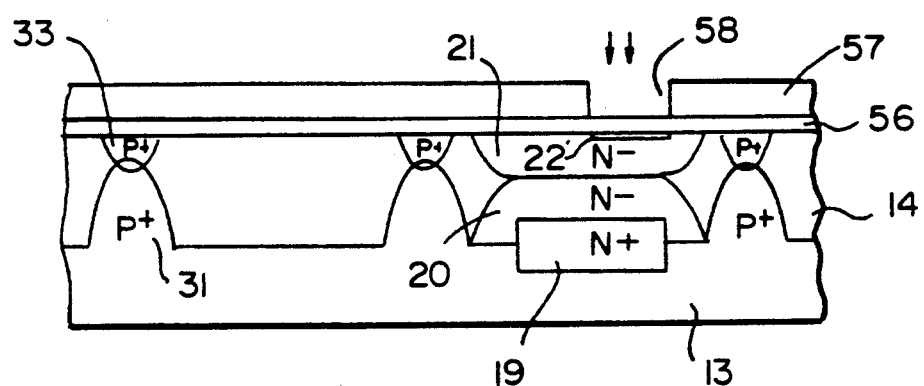

Referring now to FIG. 5(B), oxidized membrane 32 is removed and a new oxidized membrane 56 is produced by heating the device in an oxygen atmosphere. A positive resist layer 57 is coated atop oxidized membrane 56, and is dried, exposed and etched to produce an opening 58. Boron is ion implanted through opening 58 at a dose of $10^{14}$ to $10^{16}$ per cm$^2$ at about 40 KeV into the surface of epitaxial area 14 to produce a precursor 22' of P-type base area 22.

Figure 5C:
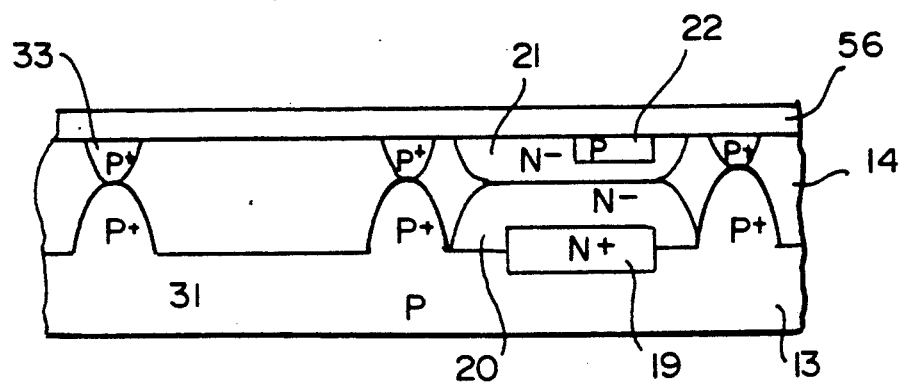

Referring now to FIG. 5(C), resist layer 57 is removed, and the precursor 22' is diffused downward by heating at a temperature of about 1100° C. for about 1 to 2 hours. This heating also thickens resist layer 57 to about 5000 to 7000 Angstroms.

Figure 5D:
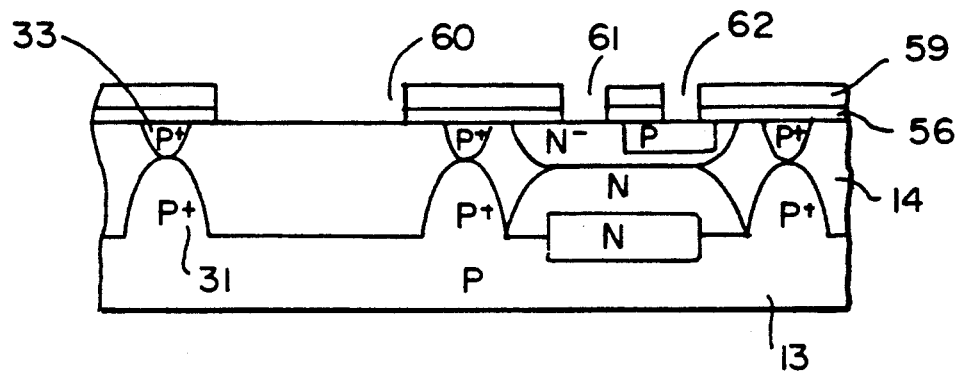

Referring now to FIG. 5(D), a further negative resist layer 59 is coated on oxidized membrane 56, dried, exposed and etched to produce openings 60, 61 and 62 through resist layer 59 and oxidized membrane 56.

Figure 5E:
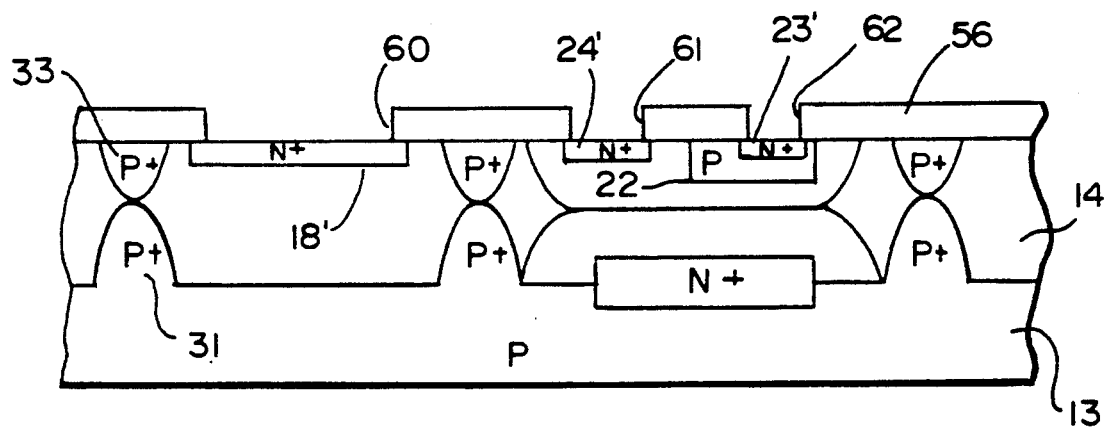

Referring now to FIG. 5(E), resist layer 59 is removed and a layer of phosphorus (not shown) is coated atop oxidized membrane 56, contacting the upper surface of epitaxial area 14. The device is heat treated to diffuse a suitable amount of phosphorus into the upper surface of epitaxial area 14 to produce N+-type precursor areas 18', 23' and 24'.

Figure 6:
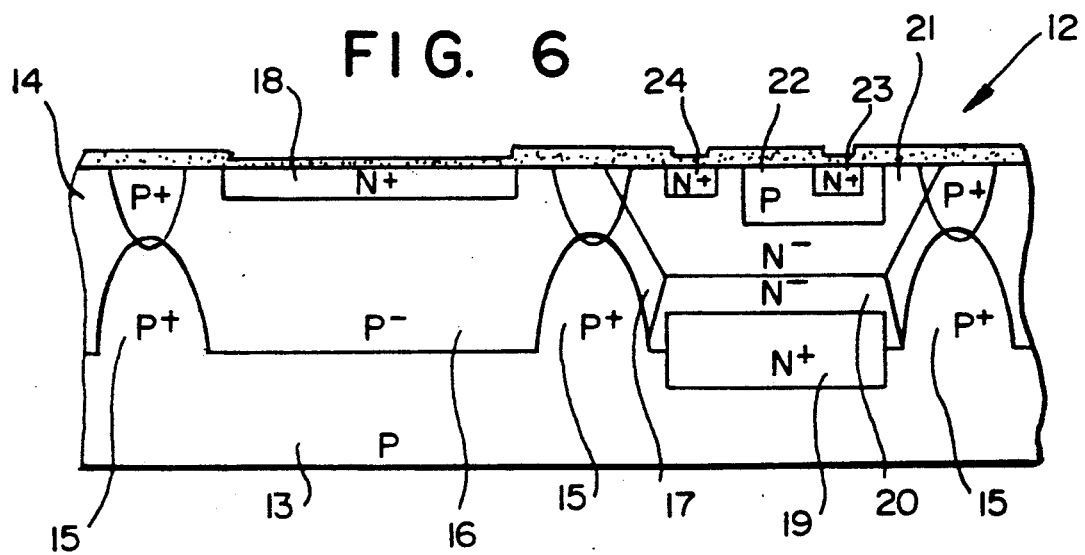

Referring now to FIG. 6, the remainder of the phosphorus layer is removed, and the device is heat treated to diffuse the phosphorus to form N+ regions including N-type diffusion area 18, collector contact area 24 and N+-type emitter area 23. It is to be noted that all three N+ areas are created during the same process step.

Returning now to FIG. 1, oxidized membrane 56 is removed, and the upper surface of epitaxial area 14 is oxidized to form membrane 25. A resist coating (not shown) is applied and etched to provide five openings through membrane 25. A suitable material, preferably aluminum, is coated on the resist coating, and through the holes to form electrodes 26, 27 and 28, collector contact 43 and base contact 28. The excess aluminum and the resist is removed to produce the final device shown.

The operation of photo diode 11 is discussed hereinafter.

Figure 7:
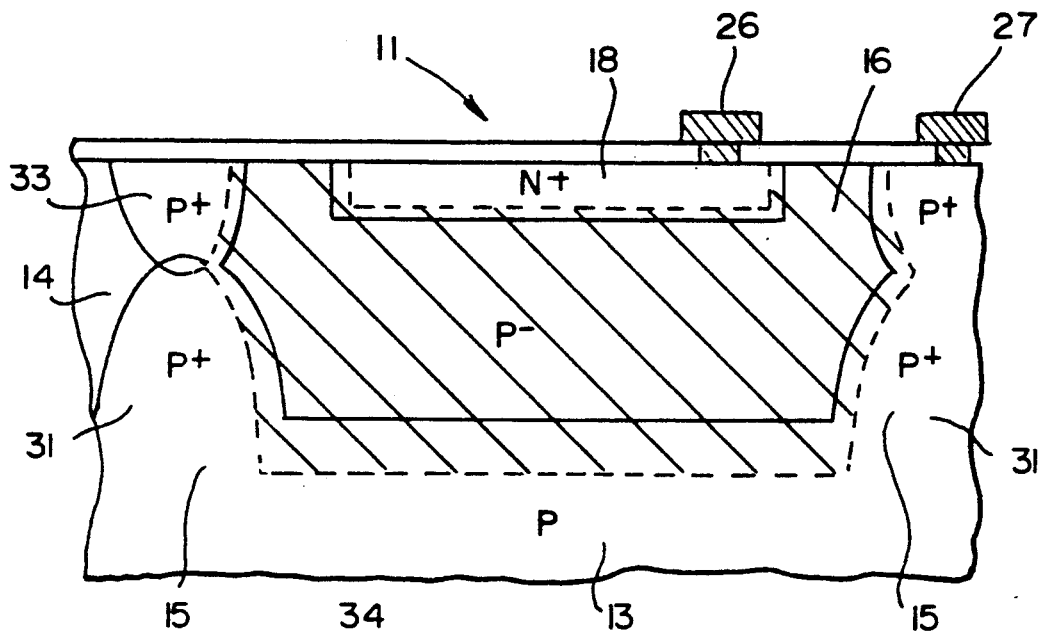
FIG. 7 is an enlarged cross section of the photo diode of FIG. 1, illustrating the depletion region formed therein.

Referring now to FIG. 7, application of ground potential (GND) to electrode 27 of photo diode 11 and a reverse bias voltage of, for example, +5 V to electrode 26, forms a large depletion region 34 at a PN junction of photo diode 11. The width of depletion region 34 is more than 10 microns since the resistivity of epitaxial area 14, being formed of intrinsic material, and doped only by incidental diffusion of P-type impurities during epitaxial growth, is very high. Accordingly, depletion region 34 extends all the way through island area 16, in its width direction beyond the boundary between epitaxial area 14 and separating area 15 and in its depth dimension, beyond its interface with substrate 13. The resistivity of substrate 13 of, for example, about 40 to 60 ohm-cm, permits depletion region 34 to extend beyond the interface into the interior of substrate 13.

The resulting very thick depletion region 34 is comparable in thickness to the thickness of epitaxial area 14. The great thickness of depletion region 34 reduces the capacitance of photo diode 11 and thus increases its response speed.

Figure 9:
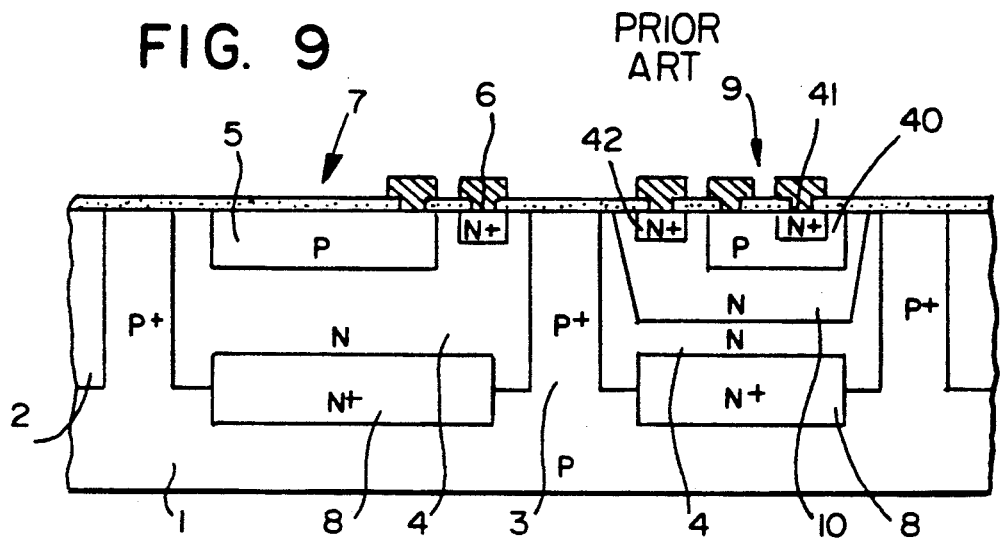
FIG. 9 is a cross section of an optical semiconductor device according to the prior art.

Further, since the PN junction extends all the way through island area 16, the PN junction is, in fact, between N+-type diffusion area 18 and separating area 15. That is, there is no PN junction betweeen island area 16 and separating area 15. Therefore there is no junction capacitance corresponding to that in the prior-art device of FIG. 9 between N-type island area 4 and P+-type separating area 3. This further enables reduced capacitance and increased response speed in photo diode 11.

Figure 8:
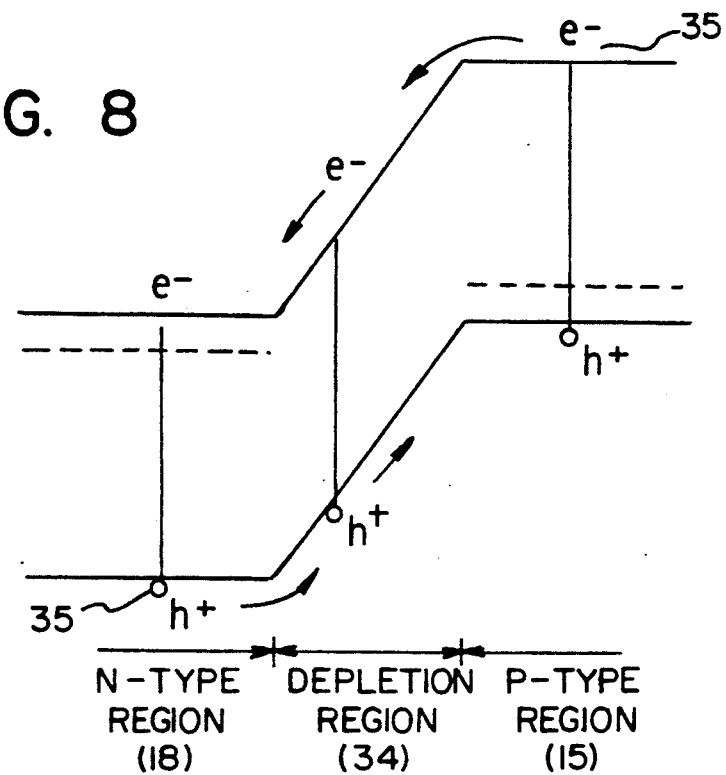
FIG. 8 is a curve illustrating the energy bands of the photo diode.

Referring now to FIG. 8, an incident photon of light creates an electron-hole pair in P+-type or N+-type areas 15 and 18 outside depletion region 34. The diffusion time of carriers 35 through depletion region 34 is a principal determinant of the response speed of photo diode 11. Since N+-type diffusion area 18 is produced by the same process used to produce emitter area 23 of NPN transistor 12, N+-type diffusion area 18 can be given a high concentration of N+ impurities. As a result, carriers 35 arising outside depletion region 34 in N+-type diffusion area 18 have a very short life span, and disappear almost immediately.

Carriers 35 which fail to disappear in diffusion area 18 reach depletion region 34 in a very short time, because of the shallowness of N-type diffusion area 18. As a result, carriers 35 surviving in N-type diffusion area 18 have almost no effect in reducing the response speed of photo diode 11.

Almost all of the incident light which enters depletion region 34 is absorbed therein because of its relatively large thickness, which is comparable to the thickness of epitaxial area 14. Thus, very few photons of incident light reach P-type substrate 13 to produce carriers therein. For this reason, the response speed of photo diode 11 is not degraded by a delay current responsive to carriers originating in substrate 13.

Cathode electrode 26 makes contact with highly doped N+-type diffusion area 18 which has a high concentration of impurities. Therefore the series resistance for this connection is small. Anode electrode 27 makes contact with the heavily doped P+-type separating area 15 thereby providing small series resistance for this connection. Accordingly, the speed of diode 11 even further increased.

The conductivity type of second island area 17, originally lightly P doped, is inverted to N-type by the formation of collector area 21 and second buried layer 20. This permits the fabrication of transistor 12 of the NPN type. Moreover, since second buried layer 20, produced by upward diffusion from the surface of substrate 13, is connected to collector area 21, produced by downward diffusion from the surface of epitaxial area 14, epitaxial area 14 can be made thicker, without excessively increasing its diffusion time. The concentration of impurities in second buried layer 20 increases as it approaches substrate 13, so that Vce(sat) of NPN transistor 12 is very small.

The advantages and effects of this invention are summarized as follows:

(1) Since P-type epitaxial area 14 is epitaxially grown of intrinsic material on P-type substrate 13 according to this invention, epitaxial area 14 exhibits a more stable high resistivity than is true when an N-type inverted epitaxial layer is grown on a P-type substrate.

(2) The present invention permits the formation of a much thicker depletion region 34 owing to the high resistivity of the material in which it is formed. Accordingly, the capacitance of photo diode 11 is reduced and its speed is increased.

(3) Since the PN junction is not formed between island area 16 and separating area 15, the capacitance of photo diode 11 is reduced even further.

(4) Since the PN junction is formed in N+-type diffusion area 18, which is shallow and has the same high concentration of impurities as does emitter area 23, the delay current caused by carriers 35 produced outside depletion region 34 is small, thereby the response speed of photo diode 11 is increased.

(5) Since most of the incident light is absorbed in diffusion area 18 and thick depletion region 34, hardly any carriers 35 originate outside depletion region 34 in substrate 13.

(6) Since the PN junction is formed in shallow N+-type diffusion area 18, light having a short wave length of e.g. 400 nm can be received.

The foregoing advantages permit incorporating photo diode 11 into an IC, while providing high sensitivity and superior response speed.

NPN transistor 12 has the following advantages:

(7) Second buried layer 20, produced by upward diffusion from the surface of substrate 13, is connected to collector area 21, produced by downward diffusion from the surface of epitaxial area 14, thereby permitting the thickness of epitaxial area 14 to be increased. Since diffusion takes place both upward and downward at the same time, the heat-treatment time necessary for driving-in the impurities is reduced.

(8) The concentration of impurities in second buried layer 20 increases as it nears substrate 13, so that Vce(sat) of NPN transistor 12 is reduced.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. An integrated circuit having a photo diode comprising:
   a substrate of a first conductivity type;
   an epitaxial layer of said first conductivity type epitaxially grown on a surface of said substrate;
   said epitaxial layer having a resistivity which is substantially higher than a resistivity of the substrate;
   a separating area of said first conductivity type extending from a surface of said epitaxial layer to said substrate;

said separating area defining a first island area for forming a photo diode and a second island area for forming a transistor;

said separating area isolating said first island area from said second island area;

a buried layer of a second conductivity type formed in said second island area;

a diffusion area of a second conductivity type formed on a surface of said first island area;

said diffusion area having a resistivity which is substantially lower than a resistivity of said epitaxial layer;

an inverted region of said second conductivity type in said second island area extending from an upper surface thereof to said substrate;

said inverted region forming a collector of said transistor;

a base area of said first conductivity type formed on a surface of said collector area;

an emitter area of said first reverse conductivity type formed on a surface of said base area;

said diffusion area is comprised of the same material and formed in the same process as said emitter area in said second island area; and a depletion layer located between a border of said diffusion area and said first island.

2. An integrated circuit having a photo diode according to claim 1, wherein said substrate has a resistivity of 40 to 60 ohm-cm.

3. An integrated circuit having a photo diode according to claim 1, wherein said epitaxial layer has a resistivity of 200 to 1500 ohm-cm.

4. An integrated circuit having a photo diode comprising:

a substrate of a first conductivity type;

an epitaxial layer of said first conductivity type epitaxially grown on a surface of said substrate;

said epitaxial layer having a resistivity which is substantially higher than a resistivity of the substrate;

a separating area of said first conductivity type extending from a surface of said epitaxial layer to said substrate;

said separating area defining a first island area for forming a photo diode and a second island area for forming a transistor;

said separating area isolating said first island area from said second island area;

a diffusion area of a second conductivity type formed on a surface of said first island area;

said diffusion area having a resistivity which is substantially lower than a resistivity of said epitaxial layer;

a first buried layer of a first reverse conductivity type buried in a boundary between said second island area and said epitaxial layer;

a second buried layer of a second reverse conductivity type buried above said first buried layer and extending upward from said first buried layer; and a collector area of said second reverse conductivity type extending from a surface of said second island area downward into connection with said second buried layer.

5. A transistor comprising:

a substrate of a first conductivity type;

an epitaxial layer grown on said substrate;

said epitaxial layer being doped to said first conductivity type more lightly than is said substrate to produce a substantially higher resistivity in said epitaxial layer than in said substrate;

a first isolated layer of said first conductivity type at an interface between said substrate and said epitaxial layer;

a second isolated layer of said first conductivity type at a surface of said epitaxial layer congruent with said first isolated layer;

said first isolated layer and said second isolated layer defining a perimeter of an island area;

said first isolated layer being diffused upward and said second isolated layer being diffused downward until they join each other, thereby isolating a contained portion of said epitaxial layer as an island area;

a buried layer of a second conductivity type at said interface between said substrate and said epitaxial layer in said island area;

a first layer of said second conductivity type at a surface of said epitaxial layer aligned with said buried layer;

said buried layer being diffused upward and said first layer being diffused downward until they join each other, thereby forming an region of inverted conductivity type in said island area;

a base area of said first conductivity type formed in said surface of said region of inverted conductivity type;

an emitter area of said second conductivity type formed in a surface of said base area; and a collector contact of said second conductivity type formed in a surface of said region of inverted conductivity type outside said emitter area.

6. A photo diode integrated with a transistor comprising:

a P-type substrate;

an epitaxial region grown on said P-type substrate of intrinsic material and autodoped to P-type conductivity;

a separating area extending from a surface of said epitaxial region to said P-type substrate;

said separating region defining first and second island regions isolated from each other;

an N+-type diffusion area formed in a surface of said first island region;

an N+-type buried layer formed at an interface between said second island region and said substrate;

a second N-type buried layer extending upward from said N+-type buried layer toward a surface of said second island;

an N-type collector area extending downward from said surface of said second island into contact with said second N-type buried layer;

a P-type base area formed in a surface of said N-type collector area; and an N+-type emitter area formed in a surface of said base area.

7. Apparatus according to claim 6, wherein said N+-type diffusion area and said N+-type emitter area are commonly formed.

8. Apparatus according to claim 6, wherein:

said separating region includes a lower separating region extending upward from said substrate;

said separating region includes an upper separating region extending downward from said surface and electrically connecting with said lower separating region.

9. An integrated circuit having a photo diode comprising:
- a substrate of a first conductivity type;
- an epitaxial layer epitaxially grown from intrinsic material on a surface of said substrate;
- said epitaxial layer having a resistivity which is substantially higher than a resistivity of the substrate;
- a separating area of said first conductivity type extending from a surface of said epitaxial layer to said substrate;
- said separating area defining a first island area for forming a photo diode and a second island area for forming a transistor;
- said separating area isolating said first island area from said second island area;
- a buried layer of a second conductivity type formed in said second island area;
- a diffusion area of a second conductivity type formed on a surface of said first island area;
- said diffusion area having a resistivity which is substantially lower than a resistivity of said epitaxial layer;
- an inverted region of said second conductivity type in said second island area extending from an upper surface thereof to said substrate;
- said inverted region forming a collector of said transistor;
- a base area of said first conductivity type formed on a surface of said collector area;
- an emitter area of said first reverse conductivity type formed on a surface of said base area; and
- said diffusion area is comprised of the same material and formed in the same process as said emitter area in said second island area.

* * * * *